(12) United States Patent  (10) Patent No.: US 9,035,704 B2
Pesetski et al.  (45) Date of Patent: May 19, 2015

(54) HIGH IMPEDANCE MICROWAVE ELECTRONICS

(75) Inventors: Aaron A. Pesetski, Gambrills, MD (US); Hong Z. Pesetski, Gambrills, MD (US); James E. Baumgardner, II, Odenton, MD (US); Dale E. Dawson, Glen Burnie, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 1266 days.

(21) Appl. No.: 12/896,349

(22) Filed: Oct. 1, 2010

(65) Prior Publication Data

US 2012/0081184 A1  Apr. 5, 2012

(51) Int. Cl.
 *H03F 3/04* (2006.01)
 *B82Y 10/00* (2011.01)

(52) U.S. Cl.
 CPC . *B82Y 10/00* (2013.01); *H03F 3/04* (2013.01); *H01L 2223/6655* (2013.01)

(58) Field of Classification Search
 CPC ........ B82Y 10/00; B82Y 40/00; B82Y 30/00; B82Y 15/00; B82Y 20/00; H01L 51/0048; H01L 51/0541; H01L 51/0545; Y10S 977/938
 USPC .............................. 330/98, 150, 277, 302, 310
 See application file for complete search history.

(56) References Cited

U.S. PATENT DOCUMENTS

| | | | |
|---|---|---|---|
| 6,137,367 A | 10/2000 | Ezzedine et al. | |
| 6,788,112 B1 | 9/2004 | Chan et al. | |
| 7,176,762 B2 | 2/2007 | Johnson | |
| 7,214,910 B2 | 5/2007 | Chen et al. | |
| 7,391,235 B2 | 6/2008 | Mouttet | |
| 7,616,705 B1 | 11/2009 | Tso et al. | |
| 7,847,633 B2 * | 12/2010 | Kinget | 330/253 |
| 8,305,247 B2 * | 11/2012 | Pun et al. | 330/258 |
| 2002/0126031 A1 | 9/2002 | Hoenlein et al. | |
| 2005/0107062 A1 | 5/2005 | Miyagi | |
| 2006/0267682 A1 | 11/2006 | Grebennikov | |
| 2007/0222523 A1 | 9/2007 | Arell | |
| 2009/0110035 A1 | 4/2009 | Sutton et al. | |
| 2010/0045383 A1 | 2/2010 | Maruyama | |

OTHER PUBLICATIONS

International Search Report and Written Opinion of the International Searching Authority, Int'l Apn. No. PCT/US2011/054269, dated Jan. 19, 2012, 23 pages.

(Continued)

*Primary Examiner* — Khanh V Nguyen
(74) *Attorney, Agent, or Firm* — Rothwell, Figg, Ernst & Manbeck, P.C.

(57) ABSTRACT

High impedance, high frequency nanoscale device electronics configured to interface with low impedance loads include an impedance transforming stage constructed of multiple nanoscale devices, such as carbon nanotube field-effect transistors. In an embodiment of the present invention, an impedance transforming output stage of a multistage amplifier is configured to drive a 50 ohm transmission line with unity voltage gain using multiple carbon nanotube field-effect transistors in parallel. In a further embodiment, a receiver provided for an electronically steered receive array is a monolithic, lumped-element system formed from nanoscale devices and configured to interface with the external electrical systems via a single transmission line.

23 Claims, 9 Drawing Sheets

(56) References Cited

OTHER PUBLICATIONS

Lee, J-R., et al., "A Novel Bandpass Filter Using Active Capacitance", Dept. of Electronic Engineering, Sogang Univ., Seoul, 121-742, Korea and Millimeter-wave Innovation Technology Research Center, Dongguk Univ., Seoul, 100-715 Korea, 2003 IEEE MTT-S Digest, pp. 1747-1750.

Diab, H., et al., "Microwave Active Filter Using Finite Gain Amplifier", ENSEA, 6, avenue du Ponceau 95014 Cergy-Pontoise Cedex, downloaded from the Internet on Feb. 26, 2010, 4 pages.

Darcel, L., et al., "New MMIC Approach for Low Noise High Order Active Filters", Thales Airborne Systems, 2 Av. Gay Lussac, 78851 Elancourt, France and LISIF, University Pierre and Marie Curie, 4 place Jussieu, BP252, 75252 Paris, Cedex 05, France, 2005 IEEE, pp. 787-790.

Baumgardner, J.E., et al., "Inherent linearity in carbon nanotube field-effect transistors", Applied Physics Letters 91, 052107 (2007), 3 pages.

Kim, I-S, et al., "Analysis of a Novel Active Capacitance Circuit Using BJT and its Application to RF Bandpass Filters", Department of Electronic Engineering, Sogang University, Sinsu-dong, Seoul, 121-742, Korea and Millimeter-wave Innovation Technology Research Center Dongguk University, Pil-Dong, Joong-Gu, Seoul, Korea, 2005 IEEE, pp. 2207-2210.

Martel, R., "Single- and multi-wall carbon nanotube field-effect transistors", Applied Physics Letters, vol. 73, No. 17, Oct. 26, 1998, pp. 2447-2449.

* cited by examiner

HIGH IMPEDANCE MICROWAVE ELECTRONICS

BACKGROUND OF THE INVENTION

1. Field of the Invention

The present invention relates to high frequency electronics. More specifically, the present invention relates to the integration and impedance matching of systems formed from high impedance nanoscale devices.

2. Description of Related Art

Carbon nanotubes were discovered in the early 1990s as a product of arc-evaporation synthesis of fullerenes. Scientists have since determined that carbon nanotubes have extraordinary physical characteristics, and their potential use in many different applications has attracted much attention. For example, field effect transistors formed using carbon nanotubes provide a linear response at extremely low power. Their linearity, and small size, makes the use of carbon nanotube field effect transistors ideal for low-power, highly linear systems such as radar and communications receivers or any battery powered device.

Due to their small size and structure, carbon nanotube field effect transistors are able to source only a small amount of RF current. Therefore, it is difficult to engineer systems from carbon nanotube field effect transistors that efficiently interface with the high current levels seen in the everyday world. Specifically, the input impedance of a carbon nanotube field effect transistor is capacitive, and this small capacitance gives carbon nanotube field effect transistors an input impedance on the order of 10 k$\Omega$ or more. Similarly, these devices have a very large output impedance as well. Because traditional transmission lines and loads are generally in the range of 5$\Omega$-500$\Omega$, there exists an inherent impedance mismatch between nanoscale devices and traditional high frequency devices and systems. Traditional matching techniques employing transmission line, capacitors, inductors, and resistors require the use of networks that can be large, extremely lossy, and/or narrow band and are therefore unsuitable for many high frequency applications.

Thus, there remains a need for systems and methods to effectively use high impedance carbon nanotube devices in high frequency systems.

SUMMARY OF THE INVENTION

According to an embodiment of the present invention, an output stage is provided that has a high input impedance and sufficient transconductance to drive a low impedance load, and is formed from active devices. This output stage may be formed using multiple carbon nanotube field effect transistors in parallel. After determining the individual field effect transistor properties necessary for the desired application, such as gate oxide thickness, contact material, and channel properties, the number of parallel field effect transistors is selected to provide the required transconductance for the given load. In this way, the output stage functions as an active impedance matching stage, functional over a wideband with substantial power benefits.

According to an embodiment of the present invention, a multistage amplifier is provided which includes at least one high impedance gain stage and an impedance transforming output stage formed from active devices. Using the appropriate number of carbon nanotube field effect transistors to achieve the desired transconductance for the given design constraints, the input resistance of the output stage is of the same order of magnitude as the output resistance of a high impedance gain stage. This allows the output stage to be placed in series with high impedance gain stages without need for matching. The initial stages provide voltage gain at high impedance levels while the output stage is used as an impedance transformer, stepping down the impedance with unity voltage gain. This impedance transformation essentially provides the power gain. Thus, the use of an active output stage overcomes the difficulties of impedance matching using conventional techniques at high frequencies.

According to an embodiment of the present invention, a narrow band receiver is provided for an electronically steered receive array using lumped element nanoscale components at high impedances. The receiver is comprised of a high-gain input amplifier formed from nanoscale devices and coupled to an antenna, a double-balanced image reject mixer, a phase shifter, a power combiner, and an impedance transforming output stage formed from active nanoscale devices. This output stage transforms the high-impedance devices of the receiver to 50$\Omega$ for interfacing with external electronic systems. In this configuration, the output stage consumes over half of the total system power.

Some of the advantages of the present invention over the prior art include substantial power benefits, matching benefits, and compact structure. Because the majority of system power is consumed at the output stage, the addition of front end features such as image rejection have little cost to the overall power budget. Additionally, the use of the output stage as a matching network generates an effective match between the high-impedance electronics and a low impedance load, without the difficulties of traditional matching techniques or narrow-band results. Further, systems according to the present invention may be fabricated from monolithic, lumped element devices such that the small scale of nanostructures may be fully utilized. Through the novel matching technique of the present invention, using an active output stage to transform impedance, the advantages achieved with nanoscale devices may be utilized in real world systems.

Other objects and advantages will be apparent to those of skill in the art upon review of detailed description of the preferred embodiments and the accompanying drawings, in which like components are designated with like reference numerals.

DETAILED DESCRIPTION OF THE PREFERRED EMBODIMENTS

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

Figure 1:
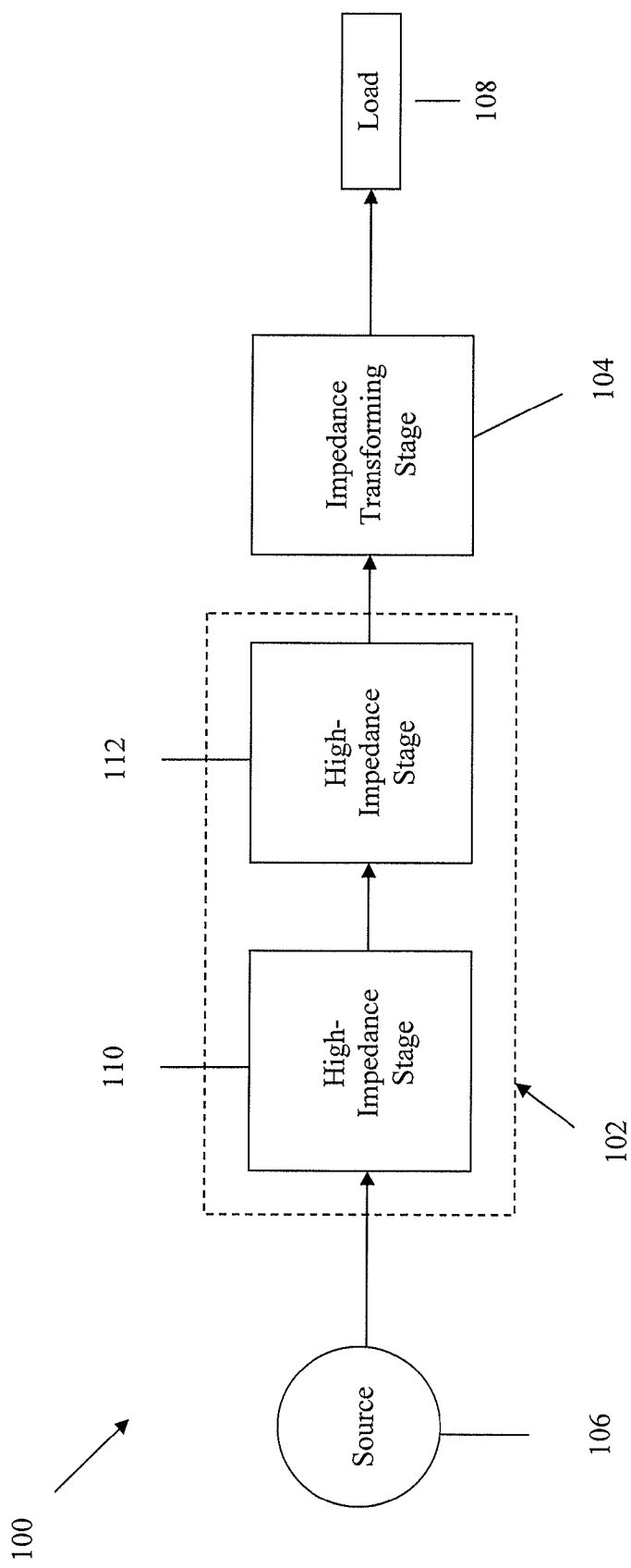
FIG. 1 is a block diagram of an electronic circuit with an impedance transforming output stage used to interface high impedance devices with an external load.

FIG. 1 shows a block diagram of a circuit according to an embodiment of the present invention. The circuit 100 includes one or more input or initial stages 102 and an output stage 104 electronically coupled to one of the initial stages and configured to receive an electronic signal there from. The initial stages, 110 and 112, of the circuit are comprised of high frequency, high impedance devices which include nanoscale devices. As used herein, the term "high frequency" refers to devices and systems operational in the microwave, millimeter wave, and sub-millimeter wave frequency regions. Examples of suitable nanoscale devices include, but are not limited to, nanowires, quantum dots, molecular transistors and carbon nanotube field-effect transistors (CNT FETs). A high frequency signal is received at the initial stages from a source 106. The initial stages may each perform one or more functions including, but not limited to, amplification, switching, or signal processing. Following the high impedance stages is an impedance transforming output stage 104 which delivers the signal to a low impedance load 108.

Figure 2:
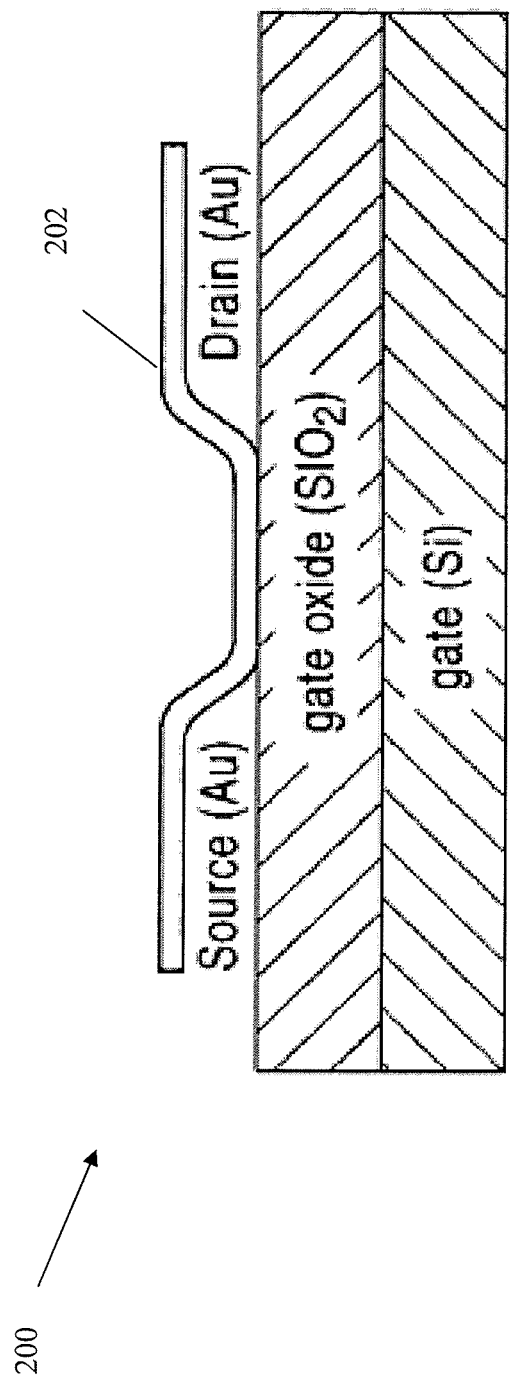
FIG. 2 is a diagram of a field-effect transistor having a carbon nantotube grown into the channel thereof.

The output stage 104 has a high input impedance and low output impedance, and is formed from active devices. Specifically, the output stage may be formed using multiple CNT FETs in parallel. FIG. 2 is a diagram of a CNT FET 200 having a carbon nantotube 202 grown into the channel thereof. This configuration was reported by International Business Machines Corporation and is published at "Single- and multi-wall carbon nanotube field-effect transistors", R. Martel, T. Schmidt, H. R. Shea, T. Hertel and Ph. Avouris, Applied Physics Letters, 73, 17, pp 2447-9, 1998, the contents of which are incorporated herein by reference.

After determining the individual FET properties necessary for the desired application such as gate oxide thickness, contact material, and channel properties, the number of parallel FETs used in the output is selected to provide a suitable transconductance to drive a low impedance load. In this way, the output stage functions as an active impedance matching stage, functional over a wideband with substantial power benefits. Thus, a circuit according to the present invention may be designed and fabricated using high impedance nanoscale devices, yet easily interface with external systems.

Figure 3:
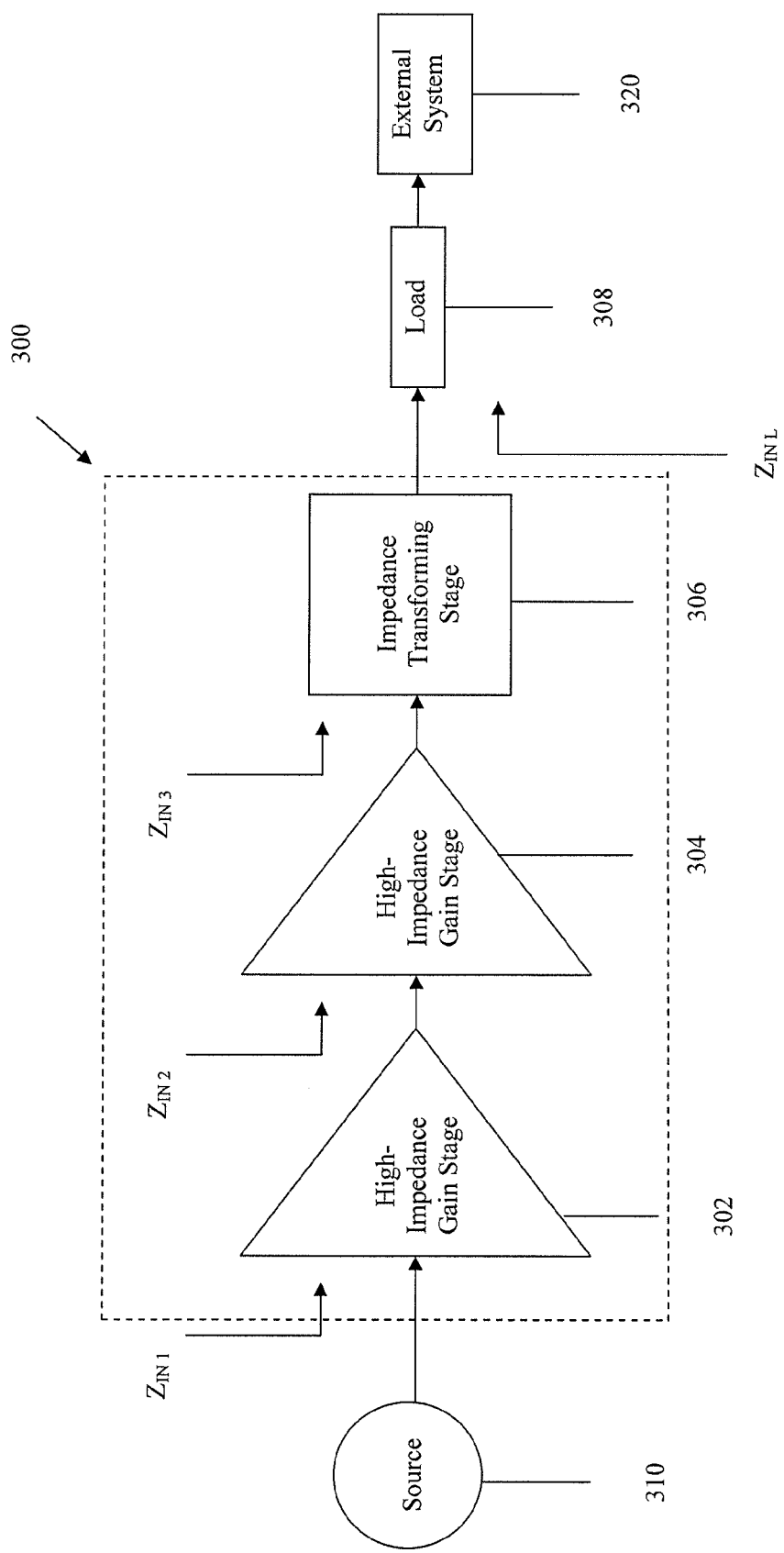
FIG. 3 is a diagram of a multistage microwave amplifier.

FIG. 3 shows a wideband amplifier 300 according to an embodiment of the present invention. The amplifier is divided into first 302, second 304, and third 306 high frequency gain stages and is designed to drive a low impedance load 308 with a signal received from source 310. Each stage is a common-source gain stage including a plurality of CNT FETs arranged in parallel. The first 302 and second 304 stages are electronically coupled such that an electronic signal is amplified by the first stage 302 and then transmitted from the drain of the first stage 302 to the gate of the second stage 304. Similarly, after being amplified in the second stage 304, the electronic signal is transmitted to the gate of the third and final stage 306. The drain of the final stage 306 is connected to a low impedance load 308, e.g., a 50Ω transmission line.

The first 302 and second 304 stages provide voltage gain at a high impedance level while the final stage 306 acts as an impedance transformer, stepping down the impedance with unity voltage gain. Specifically, the input impedance of the first stage and the input impedance of the second stage are at least an order of magnitude greater than the impedance of the low impedance load. The power gain (or current gain) is attributed to the impedance transformation provided by the final stage 306. The number of CNT FETs used in the final stage 306 is selected to provide sufficient transconductance to drive a low impedance load 308, such as a 50Ω transmission line, thus providing an interface to an external electronic system 320. External electronic systems may include, but are not limited to, transmitters and receivers, signal processing circuitry, imaging systems, or a testing system such as a network analyzer.

Figure 4:
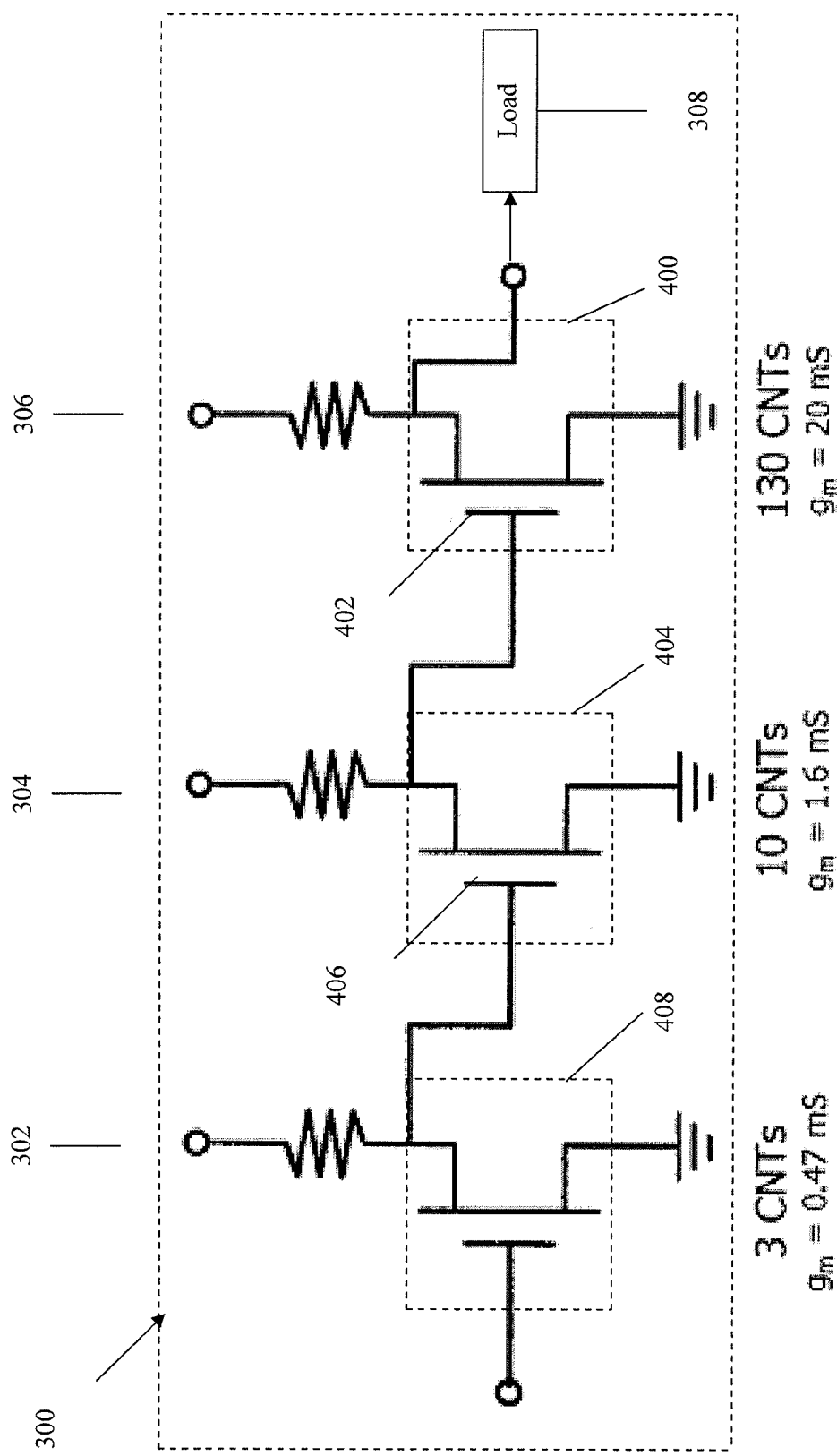
FIG. 4 is a schematic of the individual stages of the amplifier shown in FIG. 3.

Referring to FIG. 4, the final stage 306 can be configured to drive a 50Ω load 308 with unity voltage gain. The transconductance may be defined as:

$$g_m = A_V / Z_{load}$$

Therefore, a transconductance of 20 mS permits the system to drive a 50Ω load with unity voltage gain. A CNT FET has a transconductance of only about 155 μS. In an embodiment, a transconductance of 20 mS can be produced using 130 CNT FETs arranged in parallel 400.

A CNT FET device with a 0.5 micron channel has a capacitive input impedance of $10^{-4}$ pF. Thus, the final stage has a total input impedance of 0.013 pF. At X-band, this is an input impedance of approximately 1 kΩ and the final stage has a total dissipated power of 130 μW.

As shown in FIG. 4, the output of the second stage 304 can be connected directly to the gate 402 of the final stage 306. Therefore, the second stage 304 can be designed to drive a load of approximately 1 kΩ, the input impedance of the final stage 306. Having 10 CNT FETs in parallel 404, the voltage gain of the second stage 304 is $$A_V = g_m * Z_{load} = 1.55 \text{ mS} * 1 \text{ k}\Omega = 4 \text{ dB}.$$

At X-band, the second stage 304 has an input impedance of approximately 13 kΩ and dissipates about 10 μW of power.

As shown in FIG. 4, the output of the first stage can be connected directly to the gate 406 of the second stage 304. In this configuration, the first stage 302 is designed to drive a load of approximately 13 kΩ, the input impedance of the second stage 304. Because it is driving a much higher impedance load, the first stage 302 provides a substantial gain even with a relatively low total transconductance. Having only 3 CNT FETs in parallel 408, the voltage gain of the first stage is $$A_V = g_m * Z_{load} = 465 \text{ μS} * 13 \text{ k}\Omega = 16 \text{ dB}.$$

The input impedance of the first stage 302 is approximately 43 kΩ and the power dissipated in this stage is about 1 μW. The total power dissipated in the amplifier 300 is thus 143 μW. Were the amplifier to be designed with a single gain stage of CNT FETs operable to drive a low impedance load, the amplifier would dissipate as much as 1.3 mW.

In this embodiment, the majority of the total power dissipated in the amplifier 300 is spent in the impedance transforming final stage 306. Therefore, one may add additional high impedance voltage gain stages without significantly changing the power budget of the amplifier. This is important in both low-power systems as well as extremely small systems, where thermal management due to power dissipation is of critical concern.

Figure 5:
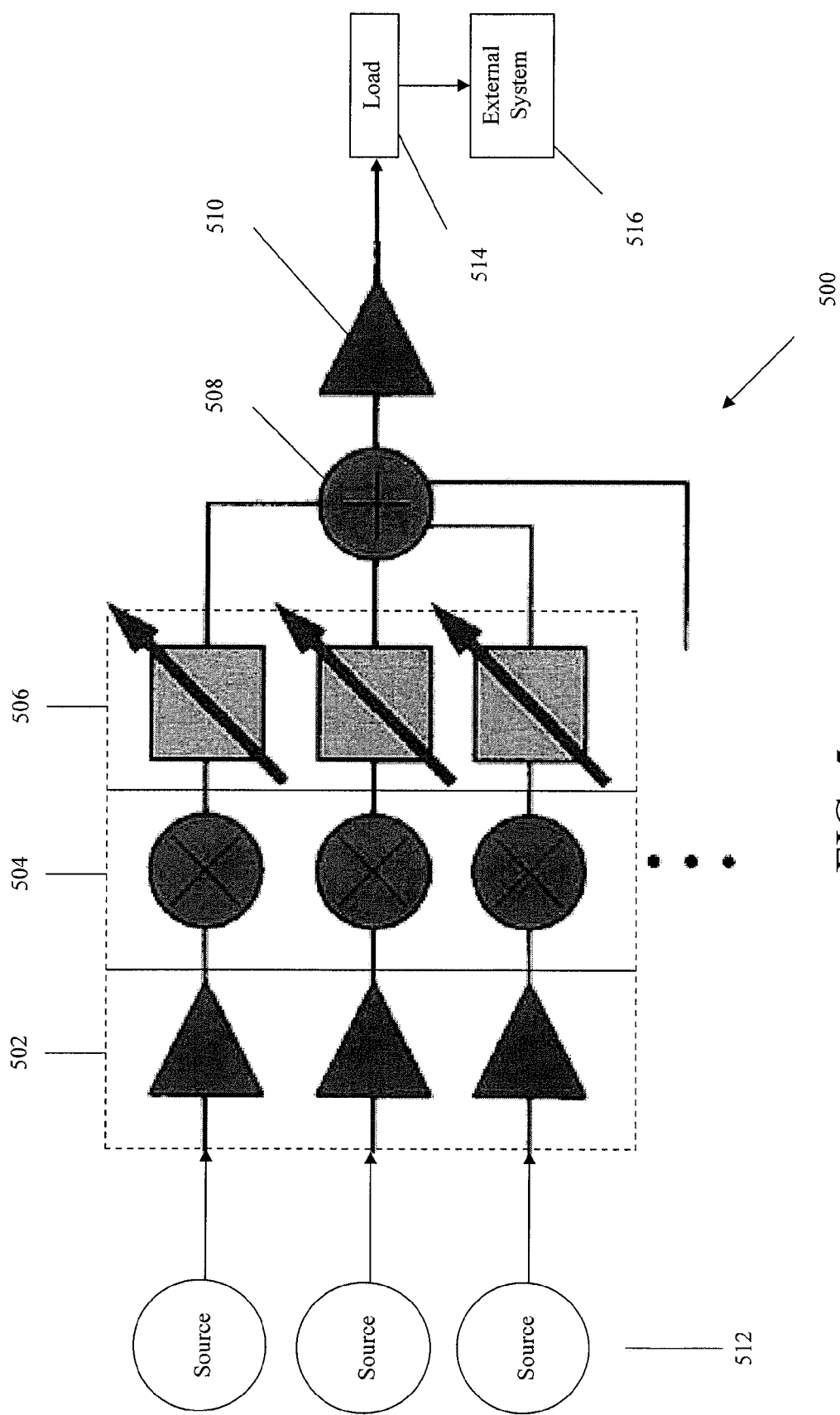
FIG. 5 is a diagram of a narrow band receiver for an electronically steered phased array.

FIG. 5 shows a narrow band receiver 500 for an electronically steered array according to an embodiment of the present invention. The receiver includes an array of low noise amplifiers (LNAs) 502, an array of image-reject mixers 504, an array of phase shifters 506, and a power combiner 508 built from high impedance nanoscale components as well as an impedance transforming output stage 510 designed to drive a low impedance load 514. Because it is not possible to construct effective transmission lines at the impedance levels of nanoscale devices, it may be necessary to construct phase shifters and power combiners from active components.

Figure 6B:
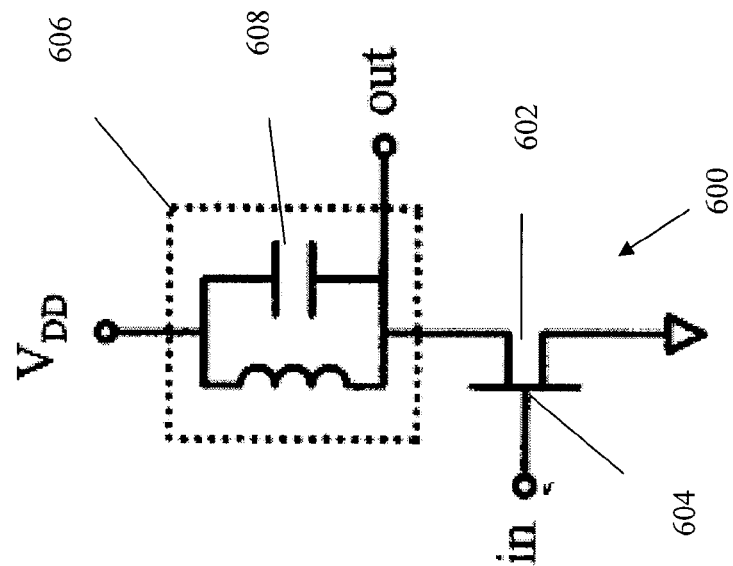
FIG. 6A is a diagram of an amplifier array and FIG. 6B is a diagram of a narrow-band common-source amplifier based on nanotechnology used in the receiver of FIG. 5.
Figure 6A:
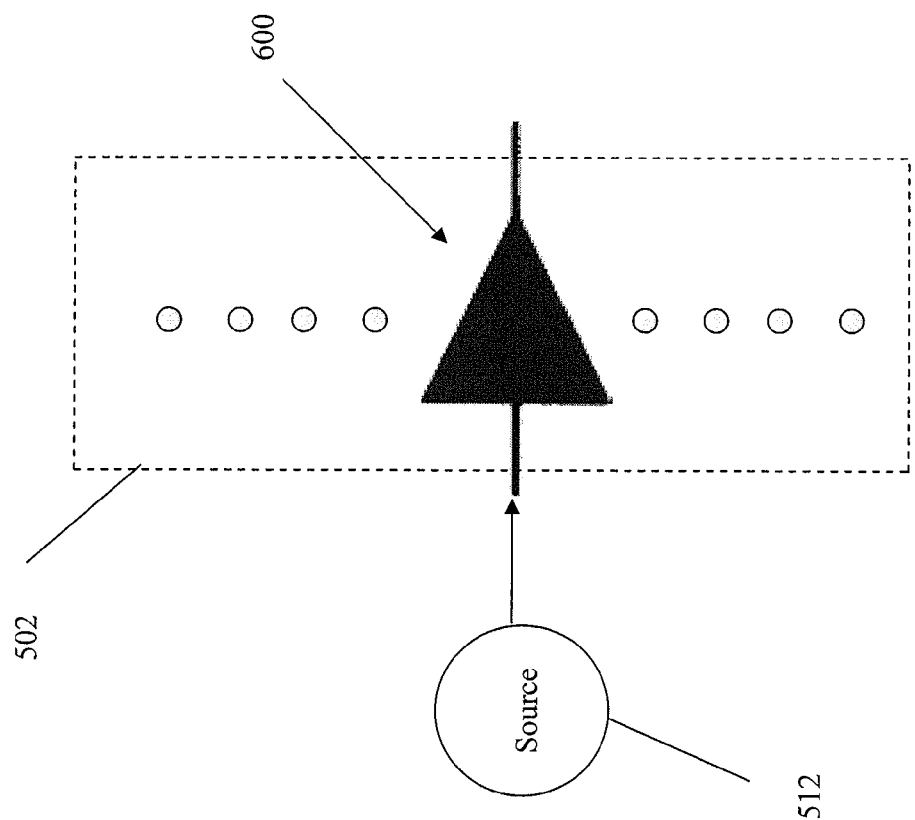

Referring to FIG. 6A, the LNA array 502 used in the receiver of the present invention is comprised of individual LNAs 600. As shown in FIG. 6B, each LNA is common source amplifier based upon a CNT FET 602 that is configured to provide a suitable voltage gain for the application, e.g., a voltage gain of 20 dB. Each LNA receives a high frequency signal from a source 512, e.g., an antenna electronically coupled to the input 604 of the LNA. The LNA may include a single CNT FET 602 and achieve a high gain through the use of on-resonance impedance of an RF filter 606. In the present embodiment, the RF filter 606 is an LC parallel resonator which provides a high impedance in the pass-band of the receiver and low impedance out of band. When selecting the value of capacitor 608 used in the filter 606, the input capacitance of the next stage may be included. Additionally, more sophisticated filters may be used to address size or frequency constraints. After being amplified, the signal is then routed to a double-balanced image-reject mixer.

Figures 7A, 7B:
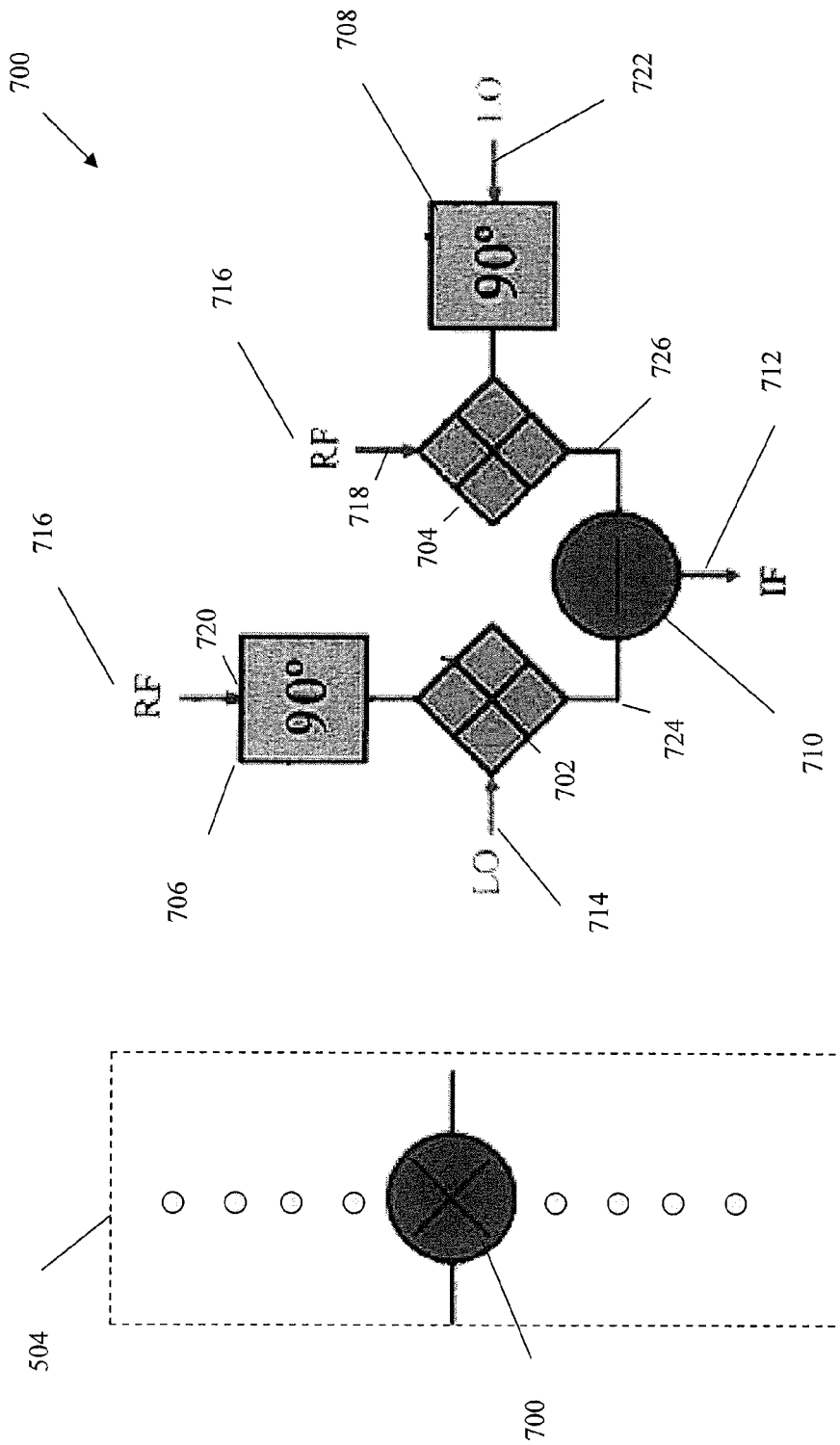
FIG. 7A is a diagram of a mixer array and FIG. 7B is a diagram of a double-balanced image reject mixer based on nanotechnology used in the receiver of FIG. 5.

FIG. 7A shows an image reject mixer array 504 comprised of individual mixers 700. As shown in FIG. 7B, a double-balanced image-reject mixer 700, comprising an element in the image reject mixer array 504, includes two double-balance mixers 702 and 704, two 90 degree phase shifters 706 and 708, and a differential power combiner 710. The electronic signal is received at node 716 from an amplifier 600 at a radio frequency (RF) port 718, and is then routed to a first double balanced mixer 704 where it is mixed with a signal from the local oscillator (LO) received at LO port 722, which has been shifted 90 degrees by phase shifter 708. Separately and simultaneously, the RF signal 716 from the amplifier 600 received at RF port 720 and then shifted 90 degrees by phase shifter 706, is transmitted to second double balance mixer 702 where it is combined with a signal from the LO received at port 714. The intermediate frequency (IF) signals outputted from the mixers are combined in a CNT FET based differential power combiner 710 generating an image rejected IF signal outputted at port 712. Adding a DC bias current to an RF port of the mixer can substantially increase device linearity without adding significantly to the power budget.

Figures 8A, 8B, 8C:
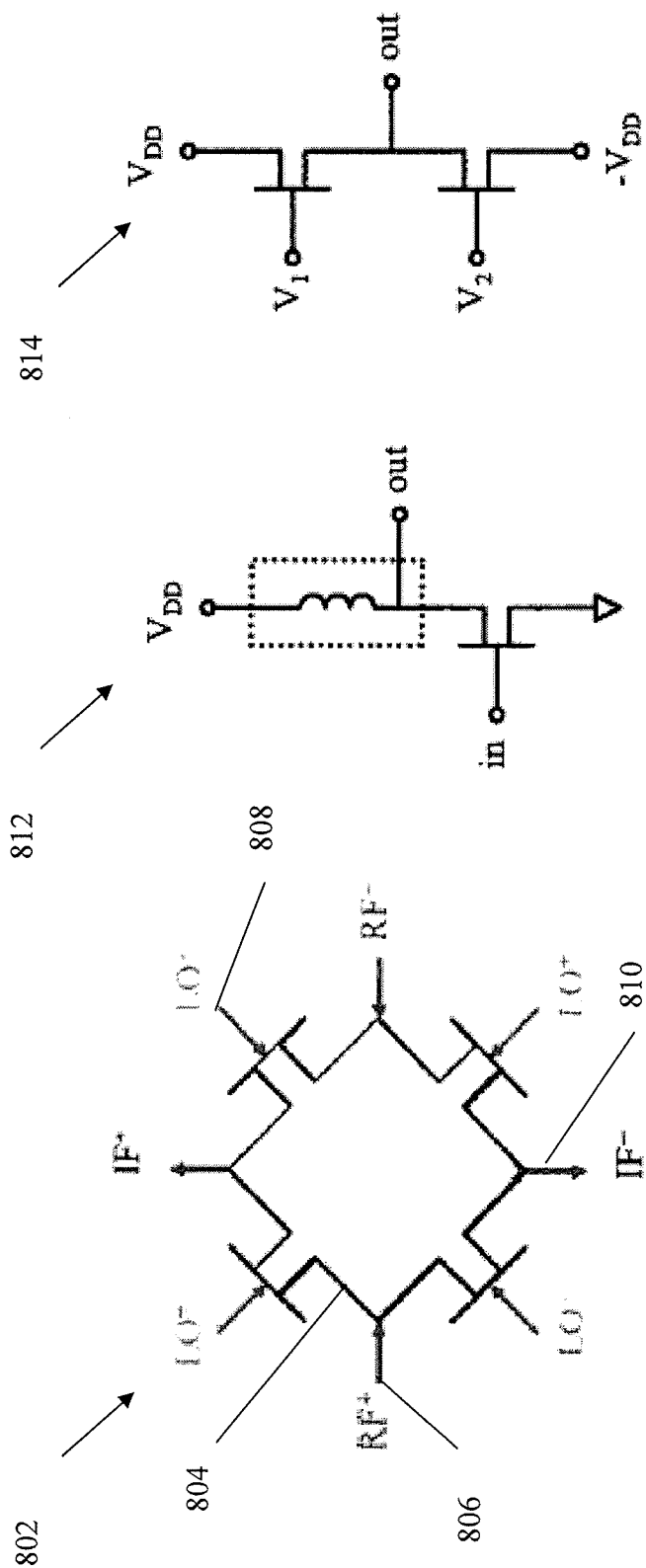
FIGS. 8A-C are schematics of the individual elements of the mixer shown in FIG. 7.

FIG. 8A shows an exemplary CNT FET based double balance mixer 802 which may be used in the image-reject mixer 700 of the present embodiment. The double balance mixer 802 includes four CNT FETs in a ring configuration 804, adapted to receive an RF signal at node 806, an LO signal at node 808, and produce an IF signal at node 810. Similarly, both the 90 degree phase shifter 812 shown in FIG. 8B and the differential power combiner 814 shown in FIG. 8C are CNT FET based as well.

Figure 9B:
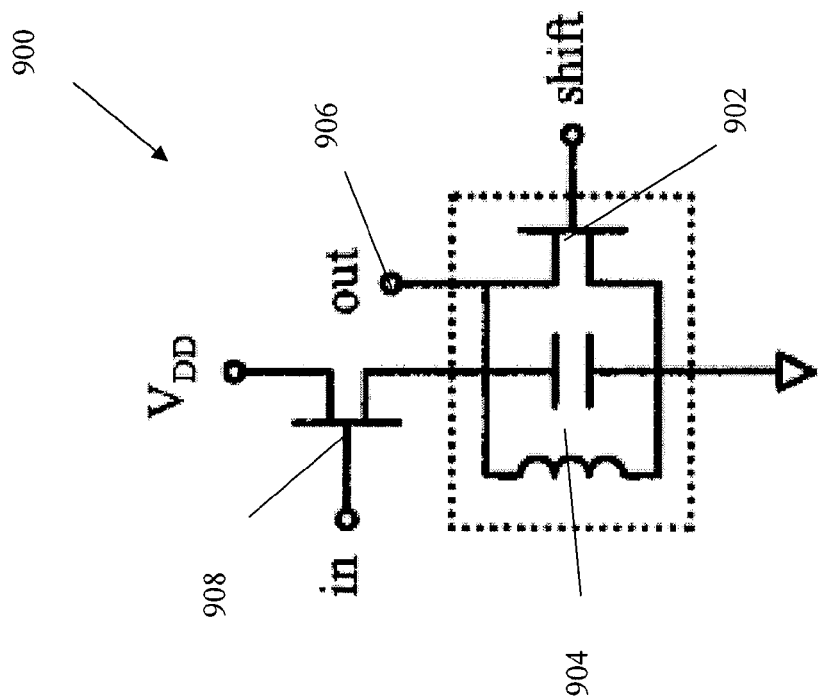
FIG. 9A is a diagram of a phase shifter array and FIG. 9B is a schematic diagram of a phase shifter based on nanotechnology used in the receiver of FIG. 5.
Figure 9A:
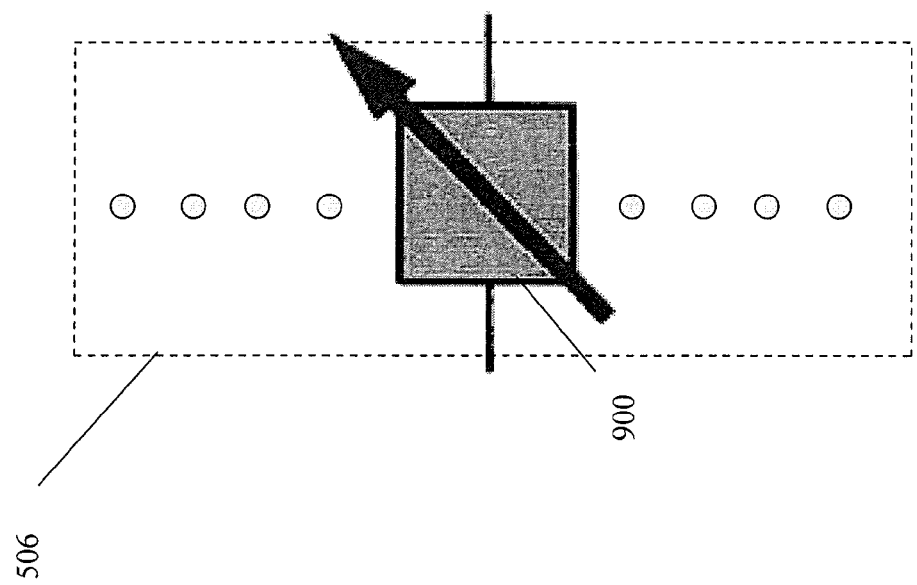

After the signals have been mixed, they are then phase-shifted and combined. FIG. 9A illustrates a phase shifting element 900 in the phase shifter array 506. FIG. 9B is a device level schematic of the phase shifting element 900. As shown in FIG. 9B, a variable phase shifter 900 may be formed from two nanoscale devices 902 and 908. Specifically, the quantum capacitance (small density of states) of the nanoscale device 902 makes it an ideal ultra-low capacitance varactor, which is used in the present system to tune an LC resonator 904. By adjusting the voltage applied to the nanoscale device 902, the phase of the signal at output node 906 may be variably shifted up to +/−45 degrees. If a larger phase shift is required, multiple phase shifters may be used in series. The output signals of each of the phase shifting elements in the array 506 are fed to the input of a combining element 508 where the signals are combined.

With reference to FIG. 5, after the input signals have been mixed, phase-shifted, and added together, they are fed to an amplifier output stage 510 comprising multiple CNT FETs in parallel as discussed in prior embodiments. The number of CNT FETs used in the output stage is selected to provide sufficient transconductance to drive the transmission line 514, thus providing an interface to external electronic systems 516. When the linearity to dissipated power ratio is maximized, the output stage 510 consumes over half of the total system power.

From the above, it will be appreciated that the novel matching technique of the present invention, using an active output stage to transform impedance, makes it possible to use nanoscale devices in an advantageous manner in real world systems.

Thus, a number of preferred embodiments have been fully described above with reference to the figures. Although the invention has been described based upon these preferred embodiments, it would be apparent to those of skill in the art that certain modifications, variations, and alternative constructions would be apparent, while remaining within the spirit and scope of the invention.

The invention claimed is:

1. A high frequency electronic circuit for driving a load with a first impedance, comprising:
   a first high frequency electronic stage including at least one nanoscale device and outputting an electronic signal with an output current insufficient to effectively drive the load; and
   a second high frequency electronic stage electronically coupled to said first high frequency electronic stage and configured to receive said electronic signal from said first high frequency electronic stage, having an input with a second impedance at least an order of magnitude greater than said first impedance, said second high frequency electronic stage including a plurality of nanoscale devices in parallel;
   wherein the number of said nanoscale devices in said second high frequency electronic stage is chosen to provide a total transconductance such that said second high frequency electronic stage is operable to effectively drive the load.

2. The high frequency electronic circuit of claim 1, wherein said second high frequency electronic stage is effectively matched to the load over a majority of an operational frequency range of said high frequency electronic circuit.

3. The high frequency electronic circuit of claim 1, wherein said high frequency electronic circuit dissipates power and at least half of the power dissipated in said high frequency electronic circuit is dissipated in said second high frequency electronic stage.

4. The high frequency electronic circuit of claim 1, wherein said second impedance is at least 10 k$\Omega$ and said first impedance is no more than 200$\Omega$.

5. The high frequency, electronic circuit of claim 1, wherein said nanoscale devices are selected from at least one of carbon nanotube field effect transistors, nanowire transistors, quantum dots, and molecular transistors.

6. The high frequency electronic circuit of claim 1, wherein said nanoscale devices each have a transconductance of less than 1 mS.

7. The high frequency electronic circuit of claim 1, wherein said second impedance is at least two orders of magnitude greater than said first impedance.

8. The high frequency electronic circuit of claim 1, wherein said second high frequency electronic stage is effectively matched to the load without the use of passive electronic components to reduce power reflection from said load.

9. The high frequency electronic circuit of claim 1, wherein said high frequency electronic circuit is a monolithic, lumped-element device.

10. The high frequency electronic circuit of claim 1, wherein the load is a single transmission line and said high frequency electronic circuit is configured to transmit said electronic signal to an external electronic system using said single transmission line.

11. The high frequency electronic circuit of claim 1, wherein said second high frequency electronic stage functions as an impedance transforming stage by stepping down impedance with a voltage gain less than or equal to unity.

12. The high frequency electronic circuit of claim 1, wherein said first high frequency electronic stage is configured to operate as at least one of an amplifier, a phase shifter, a mixer, a power combiner, a filter, or a power splitter.

13. The high frequency electronic circuit of claim 1, wherein said first high frequency electronic stage comprises a plurality of amplifiers connected in series, wherein at least one of said plurality of amplifiers includes a nanoscale device.

14. The high frequency electronic circuit of claim 1, wherein said first high frequency electronic stage comprises a plurality of electronic circuits connected in series, wherein at least one of said plurality of electronic circuits includes a nanoscale device.

15. The high frequency electronic circuit of claim 1, wherein said first high frequency electronic stage is configured to receive a plurality of electronic signals from more than one source and at least one of said nanoscale devices is configured to combine said plurality of electronic signals.

16. The high frequency electronic circuit of claim 1, wherein said second high frequency electronic stage includes a plurality of output stages and each output stage is configured to effectively drive a separate load.

17. The high frequency electronic circuit of claim 1, wherein said second high frequency electronic stage includes a plurality of output stages and each output stage is fabricated from a plurality of nanoscale devices.

18. The high frequency electronic circuit of claim 1, wherein said second high frequency electronic stage includes a plurality of output stages and each output stage is electronically coupled to said first high frequency electronic stage.

19. The high frequency electronic circuit of claim 1, wherein said electronic signal has a frequency between 300 MHz and 30 GHz.

20. The high frequency electronic circuit of claim 1, wherein said electronic signal has a frequency of at least 30 GHz.

21. A high frequency electronic receiver including the high frequency electronic circuit of claim 1, comprising:
   one or more high frequency electronic amplifiers in electrical communication with an antenna and including at least one nanoscale device;
   one or more electronic mixing elements configured to receive an electronic signal from at least one of said high frequency electronic amplifiers and including at least one nanoscale device;
   one or more phase shifting electronic elements configured to receive an electronic signal from at least one of said electronic mixing elements and including at least one nanoscale device; and
   one or more electronic signal combining elements configured to receive an electronic signal from at least one of said phase shifting electronic elements.

22. The high frequency electronic receiver of claim 21, wherein said electronic mixing element is a double-balanced image-reject mixer including at least one double-balance mixer, at least one 90 degree phase shifter, and a differential power combiner.

23. The high frequency electronic receiver of claim 21, wherein said electronic receiver has a pass band and further comprising:
   an RF filter configured to present to a high impedance within said pass band of said electronic receiver.

* * * * *